United States Patent
Wang

(10) Patent No.: US 6,845,480 B2
(45) Date of Patent: Jan. 18, 2005

(54) TEST PATTERN GENERATOR AND TEST PATTERN GENERATION

(75) Inventor: Heng-Yi Wang, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 454 days.

(21) Appl. No.: 10/058,683

(22) Filed: Jan. 28, 2002

(65) Prior Publication Data

US 2003/0145268 A1 Jul. 31, 2003

(51) Int. Cl.$^7$ .......................... G06F 11/00; G06F 7/02; G06F 9/45; G01R 31/28

(52) U.S. Cl. ................... 714/741; 714/733; 714/819; 714/33; 703/22

(58) Field of Search ...................... 714/738, 739, 714/741, 752, 733, 734, 736, 737, 724, 725, 819, 31, 32, 33, 35, 37, 46, 57; 703/13, 14, 22; 717/135

(56) References Cited

U.S. PATENT DOCUMENTS

| | | | | |
|---|---|---|---|---|
| 6,073,263 A | * | 6/2000 | Arkin et al. | 714/738 |
| 6,226,765 B1 | * | 5/2001 | Le et al. | 714/718 |
| 2002/0038439 A1 | * | 3/2002 | Sato | 714/724 |
| 2002/0144197 A1 | * | 10/2002 | Jain et al. | 714/724 |

* cited by examiner

Primary Examiner—Christine T. Tu
(74) Attorney, Agent, or Firm—J.C. Patents

(57) ABSTRACT

A test pattern generator and a method of generating a test pattern. The method includes converting a test pattern into a program and simulating the program to produce a test pattern. The test pattern is applied to a test circuit to obtain simulated test results. The program is written to a memory unit. The test circuit is tested using the program inside the memory unit to produce actual test results. The simulated test results and the actual test results are compared. If the simulated and the actual results match each other, the test circuit is repeatedly test using the test pattern until no delay between loop backs is found. However, if there is a mismatch between the simulated and the actual results, the program is adjusted and the test circuit re-tested until a match between the simulated results and the actual results is found.

19 Claims, 4 Drawing Sheets

TEST PATTERN GENERATOR AND TEST PATTERN GENERATION

BACKGROUND OF THE INVENTION

1. Field of Invention

The present invention relates to the design and system of a test pattern source generator. More particularly, the present invention relates to the design and system of a test pattern source generator that uses hardware to perform software simulation.

2. Description of Related Art

By convention, a test pattern is used to test an integrated circuit (IC). By tapping the resulting signals in an alternating current (AC) signal analyzer, a failure analysis (FA) of the IC is carried out. Hence, the generator for producing the test pattern is an important tool associated with an AC signal analysis. In general, the test pattern system must be compact and compatible with most FA equipment such as an E-beam, EMMI or probe station. To increase positioning accuracy and success rate of a FA, early acquisition of signal input/output relationships of each standard cell inside the IC is important. The AC signal source for conducting an FA, whether a measurement of detection signal inside the IC or a contrasting analysis with an E-beam-like image, is often provided by a test pattern generator. The test pattern generator produces a series of repeat runs of a dynamic signal. During a loop testing, the AC signal is expected to be stable and continuous so that clock delay time is minimized as much as possible.

A conventional test pattern generator frequently uses software simulation to produce the required test pattern. By inputting software simulated test patterns into a test IC connected to an FA station, defects inside the test IC may be detected and accurately positioned. However, the test patterns produced by a conventional test pattern generator often lead to a few problematic conditions:

1. When an EMMI FA device is used to conduct the analysis, the test pattern may position errors inside the test IC using DC signals only. Ultimately, the detection is limited to DC failure analysis such as the positioning of hot spots.
2. When a logic analysis (LA) pattern generator and an E-beam FA device are used in tandem, image flashing may occur. Such occurrence is the result of a very short test pattern execution time (in microseconds) compared with a very long processing period (in seconds) of the software/hardware stages inside the LA pattern generator due to loop delay.
3. The same situation as the one described above appears in more advanced testing stations such as the SC model. The processing time for processing a 10 Mhz testing frequency loop back delay is about 2 $\mu s$.
4. When a PC module board and an E-beam are used in tandem and a simple test pattern signal is used to carry out an image analysis of an IC, program loop and loop back delay both affect the measurement of the test signals.

Hence, test patterns are often limited to DC signals due to a special relationship with an FA device or test patterns are measured with difficulties due to loop back delay of software generated test patterns.

SUMMARY OF THE INVENTION

Accordingly, one object of the present invention is to provide a test pattern generator and a pattern generating method capable of using a test pattern to perform a dynamic testing of an integrated circuit such that the dynamic signal is continuous between one loop back and the next In other words, there is no delay between one loop back and the next.

To achieve these and other advantages and in accordance with the purpose of the invention, as embodied and broadly described herein, the invention provides a method of generating a test pattern. The method includes the following steps. A test pattern suitable for conducting a testing of a test circuit is selected. The test pattern is listed out and analyzed. The test pattern is converted to a program and a simulation of the program is carried out to obtain simulated test results. The program is written to a memory device. The test circuit is tested using the program stored inside the memory device to obtain actual test results. A comparison of the simulated and the actual test results is carried out. If there is an exact match between the simulated and the actual result, a repeat run of the test circuit using the program stored inside the memory device is performed. There is no delay between loop back for this method of test pattern generation and hence the test pattern generation method is complete. On the other hand, if there is no exact match between the simulated and the actual result, the program is inspected and adjusted until a match between the two is found.

In one embodiment of this invention, using the program inside the memory device to test the test circuit includes the following steps. First, a counter is reset. According to a test pattern cycle, the counter is initiated to start counting. The test circuit is tested using the test data signals and test length signals produced by the built-in test pattern data program code and test pattern length program code inside the program. At the end of the testing, resulting test signals from the test circuit are collected. A comparison between normal test signals operation and the resulting test signals is carried out. If the normal test signals and the resulting test signals match each other, further action is stopped and a normal indicator signal is issued. On the other hand, if there is a mismatch between the normal test signals and the resulting test signals, an error indicator signal is issued.

This invention also provides a test pattern generator. The test pattern generator produces a test pattern for testing a test circuit. The test pattern generator is comprised of a first read-only-memory unit, a second read-only-memory unit, a counter, a test circuit connector, a comparator and a control device. The first read-only-memory unit stores test pattern data program code and is capable of outputting test data signals. The second read-only-memory unit stores test pattern length program code and is capable of outputting test length signals. The counter connects electrically with the first read-only-memory unit and the second read-only-memory unit and counts according to a test pattern cycle. The test circuit connector connects electrically with the first read-only-memory unit and the second read-only-memory unit and is capable of outputting resulting test signals. The comparator stores normal test results and connects electrically with the test circuit, the first read-only-memory unit and the second read-only-memory unit. The comparator is also capable of outputting an indicator signal. The control device connects electrically with the first read-only-memory unit, the second read-only-memory unit, the counter and the comparator. The control device also receives a control signal and the indicator signal from the comparator.

This invention also provides a test pattern generator for producing a test pattern to test a test circuit. The test pattern generator is comprised of a switching device, a field programmable gate array, an output buffer, a test circuit connector, a display device and an interface board. The switching device outputs a control signal. The field programmable gate array receives the control signal and a test result signal and outputs a test data signal, a test length signal and an indicator signal. The test circuit connector receives the test data signal and the test length signal and outputs the test result signal. The output buffer drives the output indicator signal. The display device receives the indicator signal. The interface board connects electrically with the switching device, the field programmable gate array, the test circuit connector, the output buffer and the display device.

In brief, this invention provides a test pattern generator and a pattern generation method such that the test pattern is converted into a program written into a memory storage unit. The program includes both test pattern data codes and test pattern length codes. The program code is used to test a test circuit. The resulting waveform is compared with the waveform of a normal testing operation to form the source of a test pattern. The method of writing a software program into hardware and using the hardware to test integrated circuits is able to prevent delay due to dynamic loop back during a circuit testing operation.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
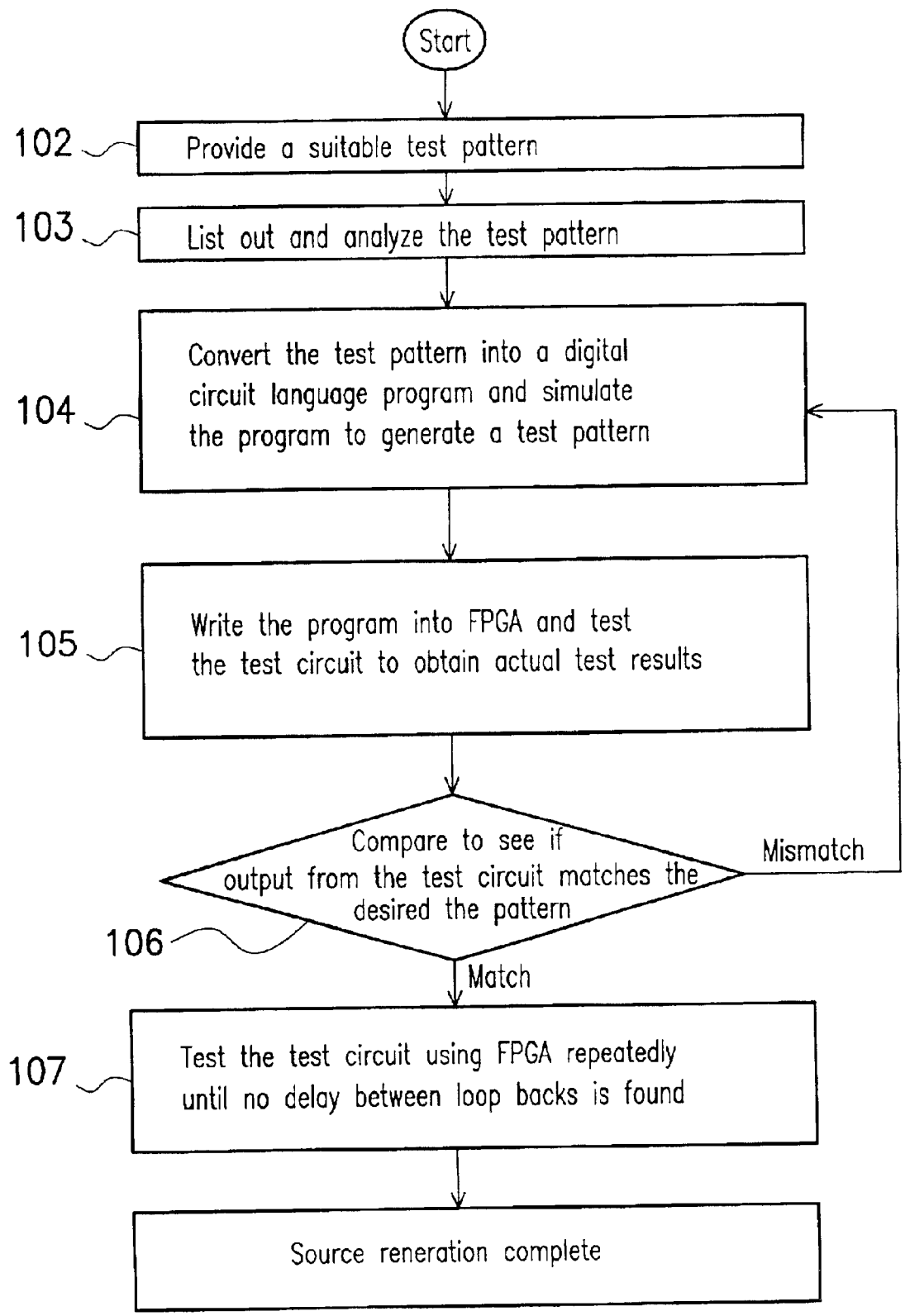
FIG. 1 is a flow-chart showing the steps for producing a test pattern according to this invention.

Reference will now be made in detail to the present preferred embodiments of the invention, examples of which are illustrated in the accompanying drawings. Wherever possible, the same reference numbers are used in the drawings and the description to refer to the same or like parts.

This invention utilizes the concept of writing a software program into a hardware device and using the hardware device to generate necessary test patterns for testing a particular integrated circuit (IC).

FIG. 1 is a flow-chart showing the steps for producing a test pattern according to this invention. According to FIG. 1, steps 102 to 107 are used to generate a test pattern for testing an integrated circuit. In step 102, a test pattern suitable for testing a test circuit is established. In step 103, the test pattern is listed out and analyzed. In step 104, the selected test pattern is converted to a program language VHDL. Thereafter, a computer simulation of the program is carried out to generate a test pattern. The test circuit is tested using the test pattern to obtain simulated testing results. In step 105, the program is recorded in hardware format by burning onto a field programmable gate array (FPGA). Another test circuit is error-checked using the FPGA to obtain actual test results. In step 106, the actual test results are compared with the simulated test results. If the actual and simulated test results are identical, the program recorded by the FPGA is run repeatedly to generate the test pattern for testing the test circuit continuously. During the continuous re-run of the FPGA program, delay time in-between loop backs for this type of pattern generation are gauged. If there is no delay, the search for a suitable test pattern generating method is finished. On the other hand, if there is a mismatch between the actual and the simulated test results, control returns to step 104 so that the program is inspected and adjusted again.

Figure 2:
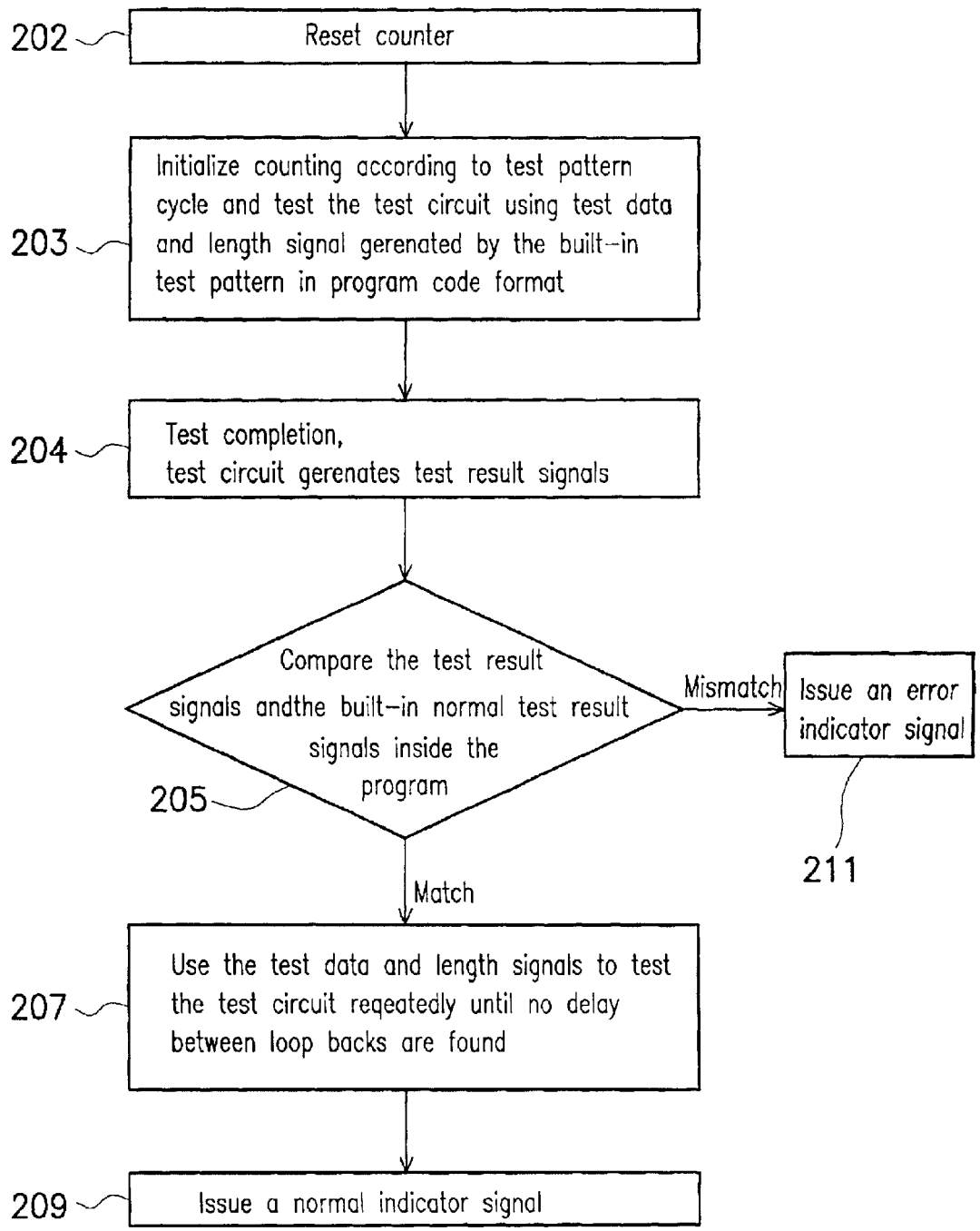
FIG. 2 is a flow chart showing the steps carried out by a memory program for producing a test pattern to test an integrated circuit according to one preferred embodiment of this invention.
Figure 3:
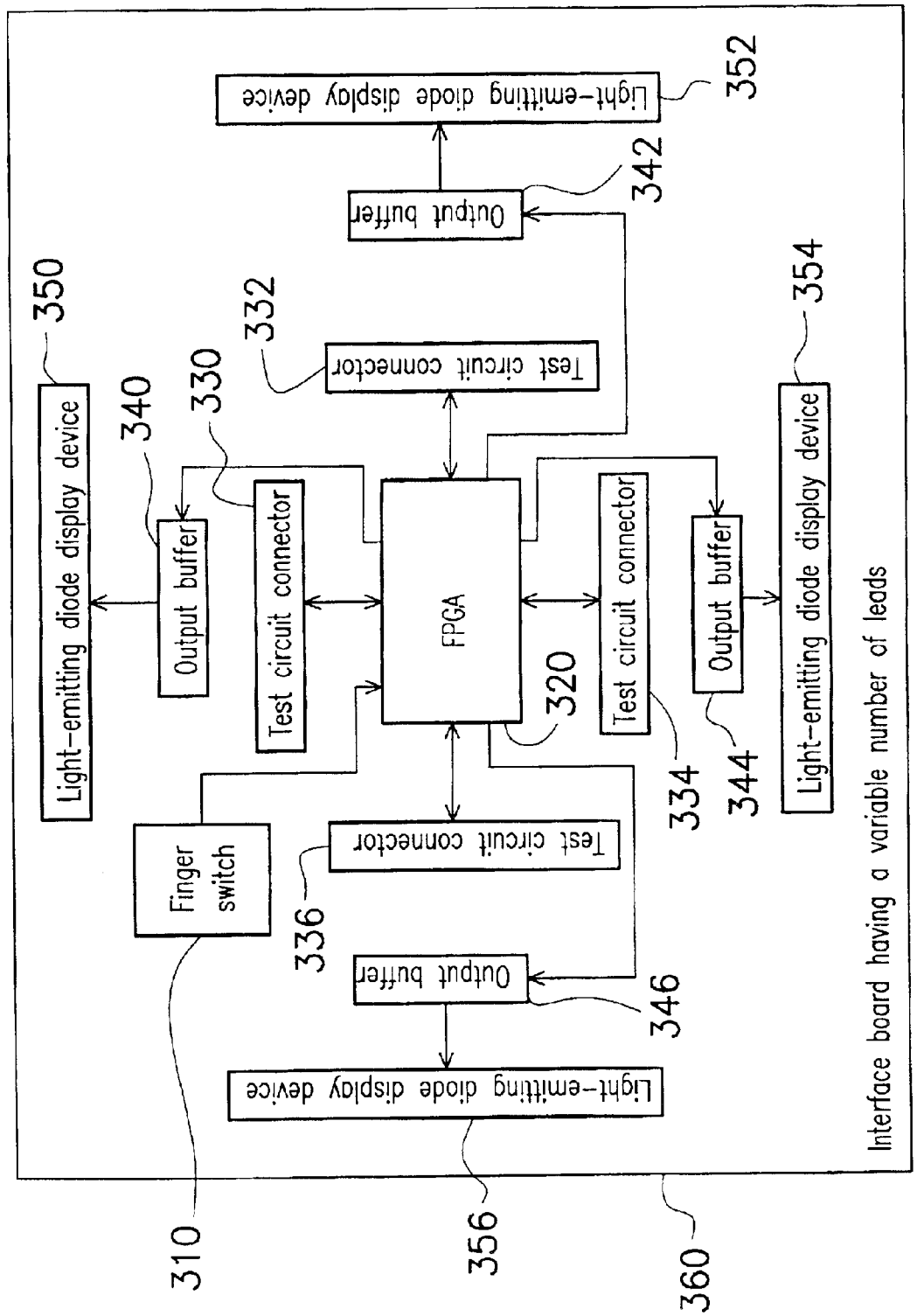
FIG. 3 is a block diagram showing the circuit of a test pattern generator according to one preferred embodiment of this invention.

FIG. 2 is a flow chart showing the steps carried out by a memory program for producing a test pattern to test an integrated circuit according to one preferred embodiment of this invention. In step 202, a program counter is reset. In step 203, the program starts counting according to a test pattern cycle. At the same time, the test circuit is subjected to test data signals and test length signals generated by the built-in test pattern program codes and test pattern length program code of the program. At the end of the testing operation, in step 204, the test circuit produces result signals. In step 205, the test results are again compared with the simulated results. If the test and the simulated results match each other, step 207 is carried out so that the test circuit is repeatedly tested using the test data and the length signals. When no delay is found between loop backs throughout the testing operation, step 209 is executed to issue a normal indicator signal. However, if there is a mismatch between the test and the simulated results, step 211 is executed to issue an error indicator signal FIG. 3 is a block diagram showing the circuit of a test pattern generator according to one preferred embodiment of this invention. As shown in FIG. 3, the test pattern generator includes a 3-bit finger switch 310, a field programmable gate array (FPGA) 320, test circuit connectors 330~336, output buffers (having labels 74LS244IC) 340~346, light-emitting diode displays 350~356 and an interface board 360 having 128 leads altogether. The test pattern generator uses the interface board 360 as a means of communicating signals to other failure analysis (FA) tools (such as E-Beam, EMMI or probe station).

The test pattern is converted into a program in VHDL language format. The program is computer simulated to generate a test pattern. The test pattern is applied to a test circuit. At the end of the testing operation, signals resulting from a normal test are obtained. The result signals are converted to VHDL program code. The converted result signals and the original program are written into the FPGA 320. Using the 3 selection switches of the 3-bit finger switch 310, a selection of eight different control signals may be sent to the FPGA 320. According to the control signal, the FPGA 320 issues test patterns to the test circuits via the test circuit connectors 330~336. After feeding a test pattern to the test circuit, the test circuit responds according to the test signals by issuing test result signals. In other words, the test circuit produces test result signals to the FPGA 320 via the test circuit connectors 330~336. Meanwhile, the FPGA 320 compares the test result signals with normal built-in result signals. By matching of the two types of signals inside the FPGA 320, different indicator signals are output to the output buffers 340~346. After all test patterns for testing various test circuits are issued, the output buffers 340~346 output signals to the display devices 350~356 respectively. The display devices 350~356 enable or disable the light-emitting diodes on the display devices 350~356 according to the indicator signals. Finally, according to the lighting condition of the diodes, any abnormality in the test patterns can be easily found. If the test pattern is found to be normal, the finger switch 310 is flipped to perform a continuous testing of the test circuit using the test pattern. If no time delay between loop backs is found in the continuous operation, the test pattern generator is properly prepared. On the other hand, if the test pattern is found to be abnormal, the program may be adjusted until a normal test pattern is observed.

Figure 4:
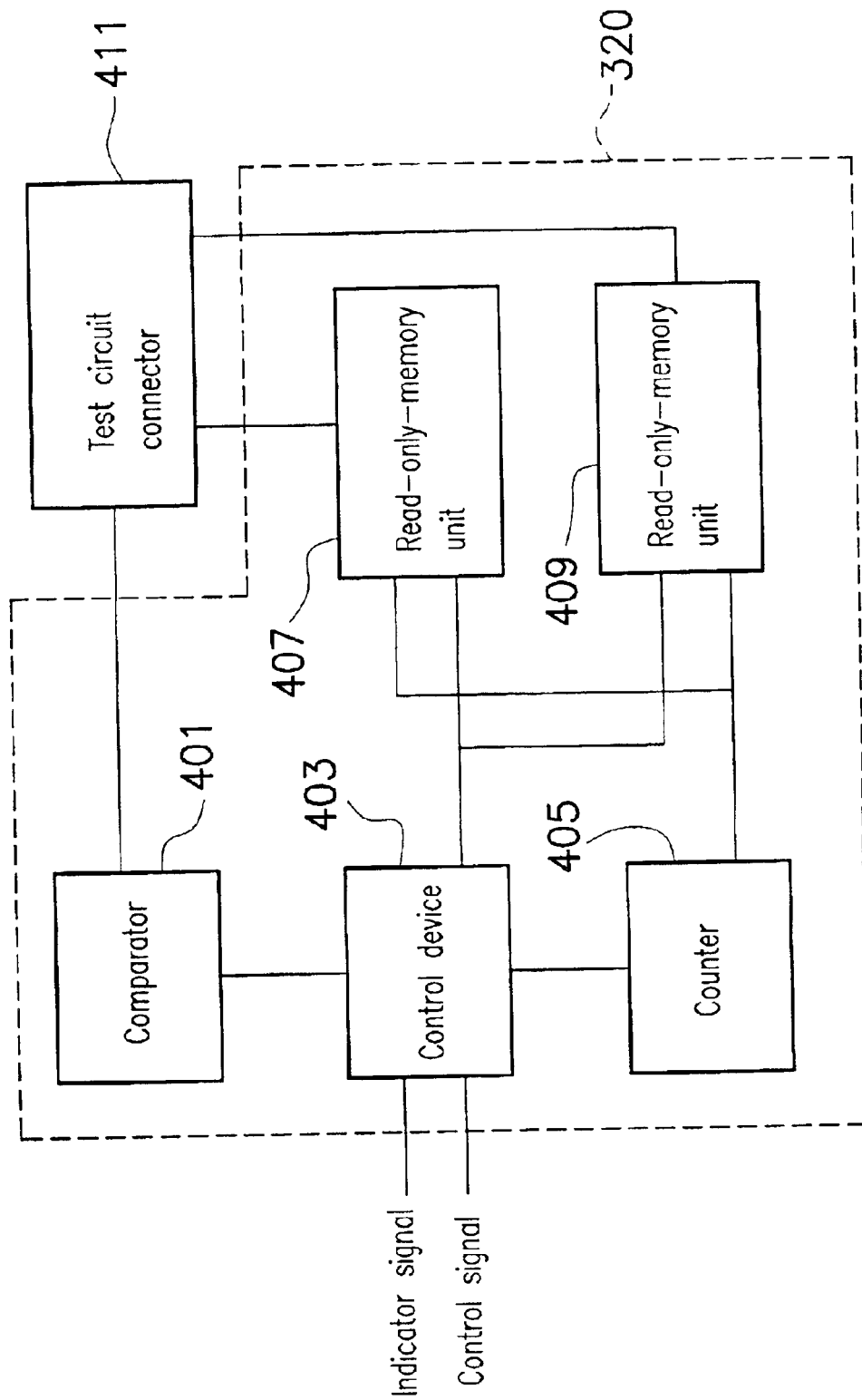
FIG. 4 is a block diagram showing the circuit inside a field programmable gate array according to one preferred embodiment of this invention.

The processes of sending test signal from the FPGA 320 to the test circuits via the test circuit connectors 330~336 are further explained with reference to FIG. 4. FIG. 4 is a block diagram showing the circuit inside a field programmable gate array according to one preferred embodiment of this invention. The FPGA 320 may be structurally divided into a comparator 401, a control device 403, a counter 405 and read-only-memory units 407 and 409. The control device 403 receives a control signal (the control signal from the 3-bit finger switch 310 shown in FIG. 3) to control the counter 405. According to the timing provided by the counter 405, the read-only-memory units (407 and 409) and the comparator 401 schedules the test pattern sent to the test circuit via the test circuit connector 411. The control signal is capable of representing one of eight different modes of controlling various devices while conducting a testing operation. In fact, each mode represents a test pattern for testing the test circuit such that the test pattern produces no time delay between loop backs. Internal operation of the test circuit is checked using stored program inside the FPGA 320. Note that the read-only-memory units (407 and 409) hold test pattern data program code and test pattern length program code respectively. The test pattern data program code represents the data content of the test pattern submitted to the test circuit. The test pattern length program code represents cycle length of the control signals for controlling the data content of the test pattern submitted to the test circuit. In other words, when test data signals controlled by the test pattern data program code are used to test the test circuit, a test length signal controlled by the test pattern length program code must be received. Using test length signal to control the test data signal and provide test cycles for testing the test circuit, a complete test pattern for the test circuit is created.

To initiate the testing of the test circuit, the control device 403 resets the counter 405. The counter 405 starts counting according to the cycle timing provided by the test pattern. In other words, the counter 405 counts according to the cycle timing represented by the test pattern length program code. The read-only-memory units (407 and 409), under the control of the control device 403 and the counter 405, start to combine each test pattern data and the output timing of the length program code to produce test signals in synchrony with the test circuit. Furthermore, constituent assembly inside the counter 405 changes according to whether the test pattern data and the length program code has an identical length. The changes are effected in accordance with Table 1 below.

TABLE 1

| D1 | D2 | D3 | ... | D8 | |
|---|---|---|---|---|---|
| L1 | L2 | L3 | ... | L8 | |
| Equal Length | | | | | |
| D1 | D2 | D3 | ... | D8 | Repeat (D6~D8) |
| L1 | L2 | L3 | ... | L8 | |
| L6_1 | L7_1 | L8_1 | | | |
| Unequal Length | | | | | |

If the test pattern data program code and the test pattern length program code have equal length, that is, both have the same numerical length without repeated appearance, only one decrement counter is required. If the test pattern data program code and the test pattern length program has an unequal length such as the duplication of program code D6~D8 while the corresponding program code L6_1~L8_1 is different from the previous program code L6~L8, the program code L6_1~L8_1 must be stored inside the read-only-memory unit and an increment counter must be used to count the program code L6_1~L8_1.

After a complete set of testing signals (the combination of the test data signals and test length data signals) is transferred to the test circuit, the test circuit responds by producing a set of test result signals. The test result signals are sent to the comparator 401 and the control device 403 orders the comparator 401 to conduct a comparison between the test result signals and the normal test result signals inside the built-in read-only-memory unit. If the test result and normal test signals match each other, the comparator 401 issues a normal indicator signal. On the other hand, if there is a mismatch between the test signals and the normal signals, the comparator 401 issues an error indicator signal. On receiving the indicator signal, the control device 403 transfers the indicator signal to the output buffers 340~346 as shown in FIG. 3.

In conclusion, this invention provides a test pattern generator and a test pattern generation method such that test pattern signals are converted into a program and written into a memory unit. The program includes test pattern data and length program codes. Test pattern for testing a test circuit is produced according to the program code. If the resulting test signals produced by the test circuit are normal, the test circuit further undergoes a continuous testing using the test pattern. The testing is considered complete when there is no delay between loop backs. In this invention, a hardware circuit generates the actual test pattern for testing a test circuit and has the special capacity to perform a simultaneous synchronous signal transmission. Ultimately, delay caused by computer generated test pattern is removed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of generating test patterns, comprising the steps of:

providing a test pattern suitable for testing a test circuit;

listing out and analyzing the test pattern;

converting the test pattern into a digital circuit description language program and simulating the digital circuit description language program to produce a simulated test pattern, applying the simulated test pattern on the test circuit to obtain simulated test results;

writing the digital circuit description language program into a memory unit;

testing the test circuit using the program inside the memory unit to produce actual test results; and comparing the simulated test results with the actual test results:

if the simulated results and the actual results match each other, the test circuit is repeatedly tested using the program inside the memory unit until no delay is found between loop backs; and if there is a mismatch between the simulated results and the actual results, the digital circuit description language program is adjusted and written back to the memory unit anew.

2. The test pattern generation method of claim 1, wherein the digital circuit description language includes a VHDL language.

3. The test pattern generation method of claim 2, wherein the digital circuit description language program further includes test pattern data program codes and test pattern length program codes.

4. The test pattern generation method of claim 3, wherein the step of using the digital circuit description language program inside the memory unit to test the test circuit includes the following sub-steps:

resetting a counter;
initializing a counting procedure according to a test pattern cycle and testing the test circuit with test data signals and test length signals generated by the test pattern data program code and the test pattern length program code according to the count;
the test circuit producing the actual test results at the end of the testing operation; and
comparing the actual test results with the simulated test results:
if the actual test results and the simulated test results match each other, a normal indicator signal is issued; and
if there is a mismatch between the actual test results and the simulated test results, an error indicator signal is issued.

5. The test pattern generation method of claim 1, wherein the memory unit includes a field programmable gate array.

6. A test pattern generator for testing a test circuit, comprising:

a first read-only-memory unit, wherein the first read-only-memory unit stores test pattern data program codes and the test pattern data program codes are to be read out for producing test data signals;
a second read-only-memory unit, wherein the second read-only-memory unit stores test pattern length codes and the test pattern length codes are to be read out for producing test length signals;
a counter electrically coupled to the first read-only-memory unit and the second read-only-memory unit, wherein the counter counts a count according to a test pattern cycle;
a test circuit connector electrically coupled to the first read-only-memory unit and the second read-only-memory unit, wherein the test circuit connector outputs test result signals;
a comparator, wherein the comparator holds a normal test result, couples electrically with the test circuit, the first read-only-memory unit and the second read-only-memory unit and outputs an indicator signal for indicating a match or a mismatch between the test result signals and the normal test result; and
a control device electrically coupled to the first read-only-memory unit, the second read-only-memory unit, the counter and the comparator, wherein the control device receives a control signal and outputs the indicator signal resulting from the comparator.

7. The test pattern generator of claim 6, wherein the counter includes a decrement counter.

8. The test pattern generator of claim 6, wherein the counter includes a system containing a decrement counter and an increment counter.

9. The test pattern generator of claim 6, wherein the comparator further includes a built-in third read-only-memory unit for holding normal test result signals.

10. The pattern generator of claim 6, wherein the first read-only-memory unit, the second read-only-memory unit, the counter, the comparator and the control device may be implemented using a single field programmable gate array.

11. A test pattern generator for generating a test pattern to test a test circuit, comprising:

a switching device for selecting and then outputting a control signal;
a field programmable gate array for receiving the control signal and test result signals and outputting test data signals, test length signals and an indicator signal;
a test circuit connector for receiving the test data signals and the test length signals and outputting the test result signals;
an output buffer for receiving the indicator signal and outputting an output signal;
a display device for receiving the output signal; and
an interface device electrically coupled with the switching device, the field programmable gate array, the test circuit connector, the output buffer and the display device.

12. The test pattern generator of claim 11, wherein the switching device includes a 3-bit finger switch.

13. The test pattern generator of claim 11, wherein the field programmable gate array may further include the following sub-components:

a first read-only-memory unit, wherein the first read-only-memory unit holds test pattern data program codes and the test pattern data program codes are to be read out for producing test data signals;
a second read-only-memory unit, wherein the second read-only-memory unit holds test pattern length codes and the test pattern length codes are to be read out for producing test length signals;
a counter electrically coupled to the first read-only-memory unit and the second read-only-memory unit, wherein the counter counts a count according to a test pattern cycle;
a comparator, wherein the comparator holds a normal test result, couples electrically with the test circuit, the first read-only-memory unit and the second read-only-memory unit and outputs the indicator signal for indicating a match or a mismatch between the test result signals and the normal test result; and
a control device electrically coupled to the first read-only-memory unit, the second read-only-memory unit, the counter and the comparator, wherein the control device receives a control signal and outputs the indicator signal resulting from the comparator.

14. The test pattern generator of claim 13, wherein the counter includes a decrement counter.

15. The test pattern generator of claim 13, wherein the counter includes a system containing a decrement counter and an increment counter.

16. The test pattern generator of claim 13, wherein the comparator further includes a built-in third read-only-memory unit for holding the normal test result.

17. The test pattern generator of claim 11, wherein the output buffer includes a plurality of 74LS244 integrated circuits.

18. The test pattern generator of claim 11, wherein the display device includes a light-emitting diode display panel.

19. The test pattern generator of claim 11, wherein the interface device includes an interface board having 128 leads altogether.

* * * * *